United States Patent [19]
Murohara

[11] Patent Number: 5,849,230
[45] Date of Patent: Dec. 15, 1998

[54] METHOD OF MANUFACTURING A CARD WITH A BUILT-IN ELECTRONIC PART, FORMED OF A PLURALITY OF RESIN LAYERS

[75] Inventor: Masaru Murohara, Yokohama, Japan

[73] Assignee: Kabushiki Kaisha Toshiba, Kawasaki, Japan

[21] Appl. No.: 607,772

[22] Filed: Feb. 27, 1996

[30] Foreign Application Priority Data

Feb. 27, 1995 [JP] Japan .................................. 7-038209

[51] Int. Cl.⁶ .................................................. B29C 33/18
[52] U.S. Cl. ............................................ 264/138; 264/496
[58] Field of Search .............................. 29/841; 264/255, 264/157, 272.17, 272.15, 272.13, 496, 138; 235/491, 492, 493, 487

[56] References Cited

U.S. PATENT DOCUMENTS

| | | | |
|---|---|---|---|
| 4,444,701 | 4/1984 | Meguiar | 264/40.1 |
| 4,542,260 | 9/1985 | Pearce | 174/52.2 |
| 4,599,212 | 7/1986 | Meyer et al. | 264/255 |
| 4,746,392 | 5/1988 | Hoppe | 156/244.12 |
| 4,849,048 | 7/1989 | Inagaki et al. | 156/275.5 |
| 5,030,407 | 7/1991 | Mollet et al. | 264/261 |
| 5,079,673 | 1/1992 | Kodai et al. | 361/783 |
| 5,087,479 | 2/1992 | McManus et al. | 427/508 |
| 5,350,553 | 9/1994 | Glaser et al. | 264/155 |
| 5,417,905 | 5/1995 | Lemaire et al. | 264/139 |
| 5,612,513 | 3/1997 | Tuttle et al. | 174/260 |

*Primary Examiner*—Kristine L. Kincaid
*Assistant Examiner*—Kamand Cuned
*Attorney, Agent, or Firm*—Pillsbury Madison & Sutro LLP

[57] ABSTRACT

A method of manufacturing a card with a built-in electronic part including a first step of mounting an electronic part, such as an LSI module, on a first bottom-covering material, applying a first molten resin onto the first bottom-covering material and the electronic part, and placing a first top-covering material on the fist molten resin. A second step includes curing the first molten resin, thereby forming a first structure of at least the first cured resin and the electronic part, and mounting the first structure on a second bottom-covering material. A third step includes applying a second molten resin onto the first structure and placing a second top-covering material on the second molten resin. A fourth step includes curing the second molten resin, thereby forming a second structure of at least the second cured resin and the first structure. A fifth step includes cutting the second structure thereby forming a card.

2 Claims, 3 Drawing Sheets

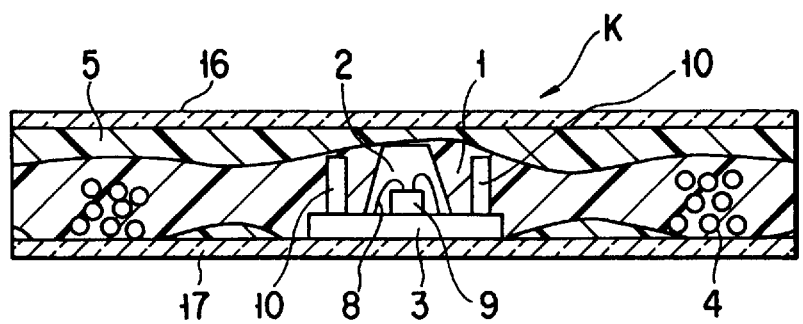
FIG. 1
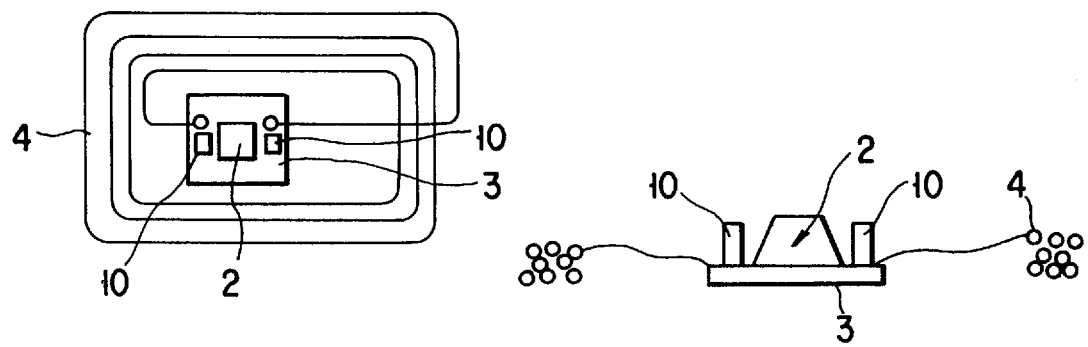
FIG. 2
FIG. 3
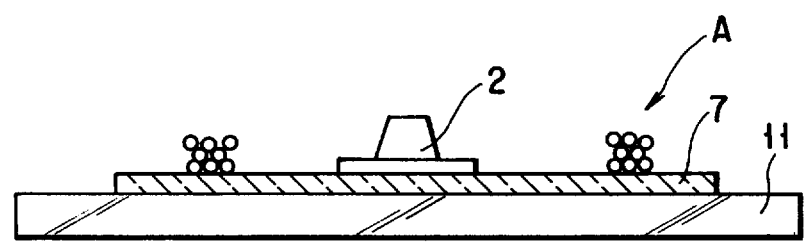
FIG. 4
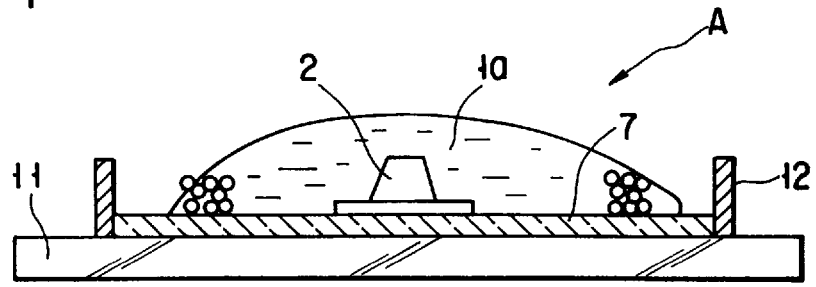
FIG. 5

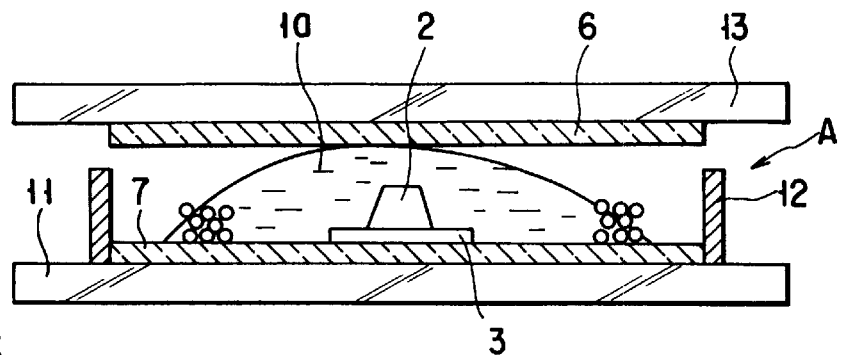
F I G. 6
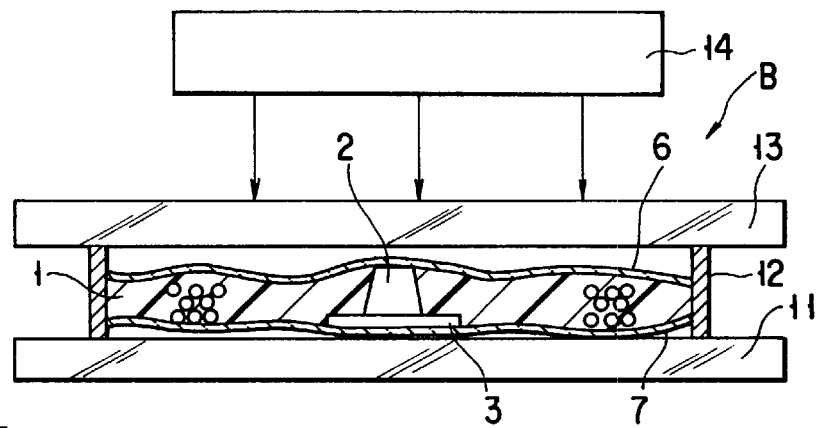
F I G. 7
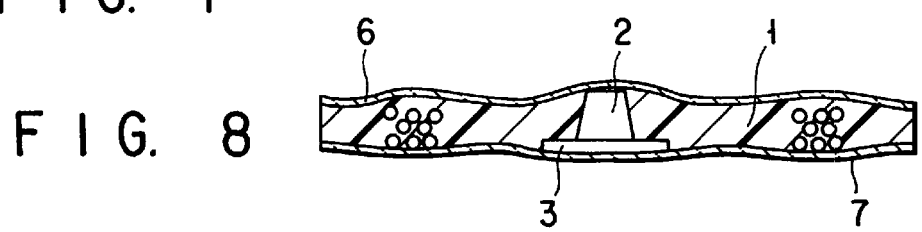
F I G. 8
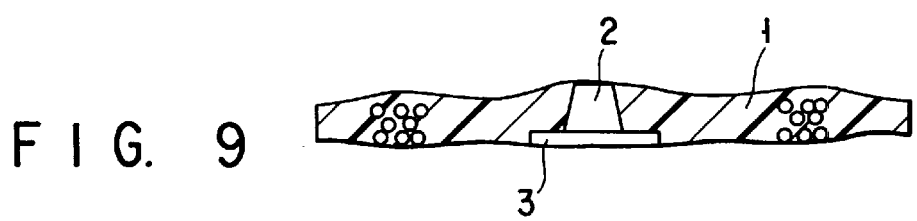
F I G. 9
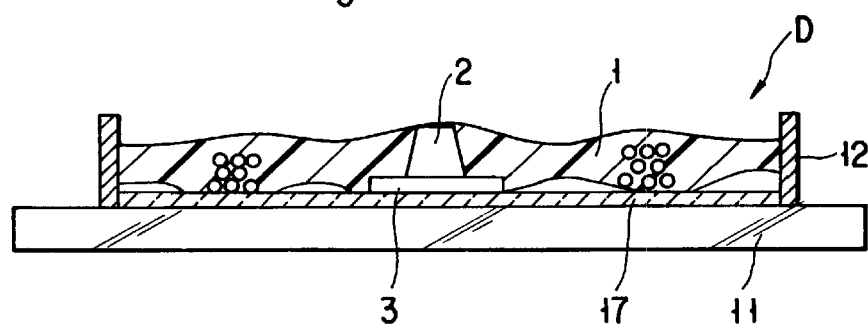
F I G. 10

METHOD OF MANUFACTURING A CARD WITH A BUILT-IN ELECTRONIC PART, FORMED OF A PLURALITY OF RESIN LAYERS

BACKGROUND OF THE INVENTION

1. Field of the Invention

The present invention relates to a method of manufacturing a card with a built-in electronic part serving as an IC card, and also relates to a card with a built-in electronic part manufactured by the method.

2. Description of the Related Art

A method of manufacturing a card with a built-in electronic part, is known in which a substrate having an electronic part mounted thereon is set in a recess previously formed in a plastic block, and the top and bottom of the plastic block are covered with a sheet.

An alternative method of manufacturing a card of a same type is known in which an electronic part is sandwiched between a top sheet and a bottom sheet, and resin is supplied into a gap between the sheets and then cured.

In the first method, the recess is made by molding or cutting the plastic block. Due to the molding or cutting, much cost and many hours are required to form the card with a built-in electronic part. In particular, when the recess is formed by cutting, disadvantageously large dimensional tolerance results.

In the latter method, the shrinkage on curing differs between portions according to whether an electronic part is present or not. As a result, the card will have a bumpy surface. Due to the bumpy surface, images such as a human face and letters cannot be printed thereon by photographic printing, because the thermal head used in the printing cannot be evenly contacted with the entire card surface.

SUMMARY OF THE INVENTION

An object of the present invention is to provide a method of manufacturing a card with a built-in electronic part, having a non-bumpy surface suitable for good photographic printing. Another object of the present invention is to provide a card with a built-in electronic part manufactured by this method.

The method of the present invention comprises a first step of mounting an electronic part on a first bottom-covering material and applying a first molten resin onto the first bottom-covering material and the electronic part, and placing a first top-covering material on the first molten resin;

a second step of curing the first molten resin, thereby forming a first structure at least one of a first cured resin and the electronic part, and mounting the first structure on a second bottom-covering material;

a third step of applying a second molten resin onto the first structure and placing a second top-covering material on the second molten resin;

a fourth step of curing the second molten resin, thereby forming a second structure consisting of at least a second cured resin and the first structure; and a fifth step of cutting the second structure, thereby forming a card.

According to this method, a bumpy surface of the first cured resin can be smoothed by the second cured resin, with the result that good photographic printing can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a side sectional view of a card with a built-in electronic part which is an embodiment of the present invention;

FIG. 2 is a plan view of an electronic part;

FIG. 3 is a front view of an electronic part;

FIG. 4 is a view showing a manufacturing step of a card with a built-in electronic part, in which an electronic part is mounted on a first bottom covering material;

FIG. 5 is a view showing a manufacturing step of a card with a built-in electronic part, in which a first molten resin is supplied onto the electronic part;

FIG. 6 is a view showing a manufacturing step of a card with a built-in electronic part, in which a first top covering material is placed on the first molten resin and further a pressurizing glass is mounted on the first to covering material to pressurize it;

FIG. 7 is a view showing a manufacturing step of a card with a built-in electronic part, in which the first molten resin pressurized by a pressurizing glass is irradiated by UV rays;

FIG. 8 is a view showing a manufacturing step of a card with a built-in electronic part, in which a first UV cured resin is taken out;

FIG. 9 is a view showing a manufacturing step of a card with a built-in electronic part, in which the top and bottom covering material are removed from the first UV cured resin taken out;

FIG. 10 is a view showing a manufacturing step of a card with a built-in electronic part, in which the first UV cured resin, from which the top and bottom covering material are removed, is disposed on a glass substrate via a second bottom covering material;

DETAILED DESCRIPTION OF THE PREFERRED EMBODIMENT

Figure 11:
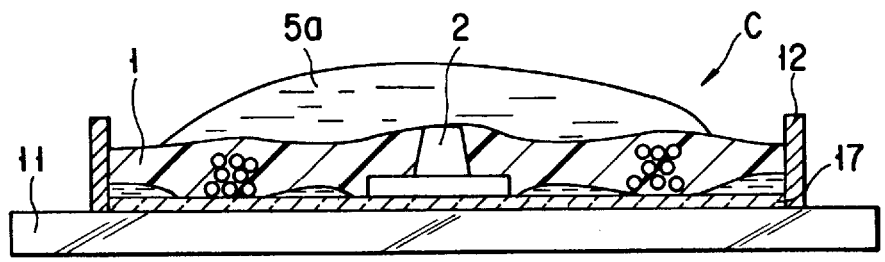
FIG. 11 is a view showing a manufacturing step of a card with a built-in electronic part, in which a second molten resin is supplied onto the first UV cured resin set on a glass substrate.

Hereinbelow, the present invention will be explained with reference to an embodiment shown in the accompanying drawings.

FIG. 1 shows a card with a built-in electronic part K.

Reference numeral 1 is a UV curing resin serving as a first curing resin. Inside the UV curing resin 1, a Large Scale Integration (LSI) module 2 as an electronic part is embedded. The LSI module 2 comprises a glass epoxy substrate 3, an LSI 9 mounted and bonded on the glass epoxy substrate 3 by wire-bonding 8, two chip condensers 10 electrically connected to the glass epoxy substrate 3 with a solder, and a coil antenna 4. The UV curing resin 1 is covered with a UV curing resin 5 serving as a second curing resin. The top and bottom surfaces of the UV curing resin 5 are further covered with a second top covering material 16 and a second bottom covering material 17, respectively. The second top and bottom covering material 16 and 17 are formed of transparent polyethylene terephthalate (PET). Either on the second top covering material 16 or on the second bottom covering material 17, an image receiving layer (not shown) is formed. On the image receiving layer, images such as a human face and letters are printed by photographic printing.

FIG. 2 and FIG. 3 are a plan view and a front view of the LSI module 2, respectively.

In the center of the glass epoxy substrate 3, the LSI 9 is disposed. To the glass epoxy substrate 3, both ends of the coil antenna 4 are connected.

Hereinbelow, a method of manufacturing the card with a built-in electronic part K will be explained.

Figure 12:
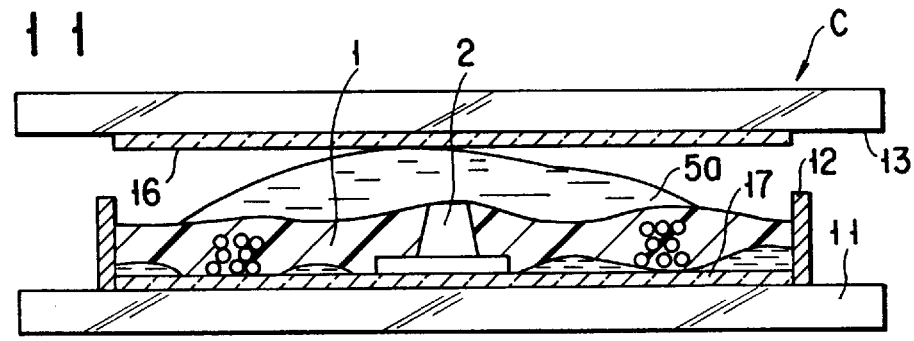
FIG. 12 is a view showing a manufacturing step of a card with a built-in electronic part, in which a second top covering material is mounted on the second molten resin and further a pressurizing glass plate is mounted on the second top covering material to pressurize it.
Figure 13:
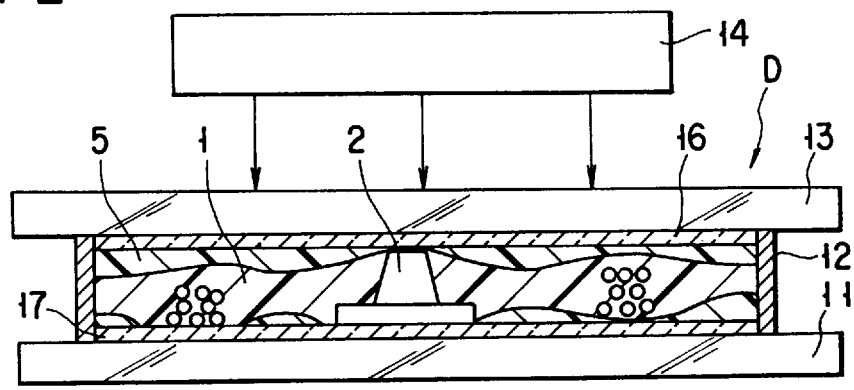
FIG. 13 is a view showing a manufacturing step of a card with a built-in electronic part, in which a UV rays are radiated onto the second molten resin pressurized b he pressurizing glass plate.
Figure 14:
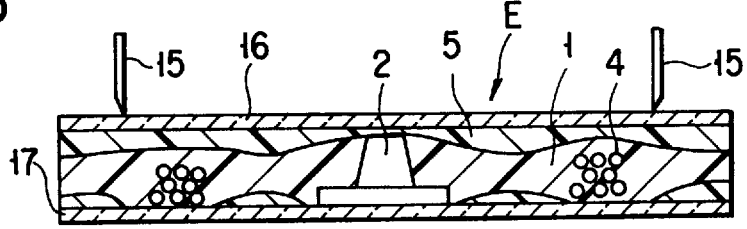
FIG. 14 is a view showing a manufacturing step of a card with a built-in electronic part, in which an integrated first and second UV cured resin is cut into a predetermine form.
Figure 15:
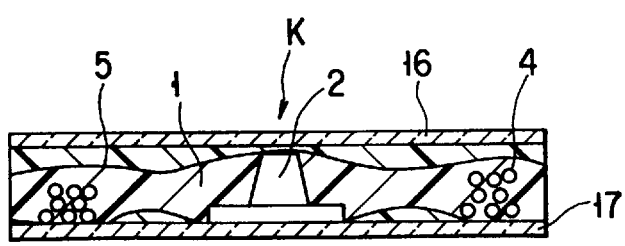
FIG. 15 is a sectional view of the card with a built-in electronic part manufactured in the present invention.

As shown in FIG. 4, a first bottom covering material 7 is placed on the top surface of a glass substrate 11. On the first bottom covering material 7, the LSI module 2 is mounted. Then, as shown in FIG. 5, the periphery of the first bottom covering material 7 is surrounded by a spacer frame 12. Thereafter, a first molten UV curing resin 1a (an ultraviolet curing resin) is supplied onto the LSI module 2. Furthermore, as shown in FIG. 6, on the molten UV curing resin 1a, a first top covering material 6 is placed (First step A). The first top covering material 6 is pressurized by a pressurizing glass plate 13. The pressurizing glass plate 13 is lowered a predetermined distance until it comes in contact with the top end surface of the spacer frame 12, as shown in FIG. 7. After the pressurizing glass plate 13 is stopped, the molten UV curing resin 1a is irradiated by UV radiation means 14 through the pressurizing glass plate 13, thereby curing the molten UV curing resin 1a (Second step B). On the surface of the UV cured resin 1, bumps are generated according to whether the LSI module 2 is present or not thereunder. After the UV cured resin 1 is taken out, as shown in FIG. 8, the top and bottom covering material 6 and 7 are removed, as shown in FIG. 9. Afterward, as shown in FIG. 10, the UV cured resin 1 is placed on the substrate 11 via the second bottom covering material 17 formed of white polyethylene terephthalate (PET). The periphery of the UV cured resin 1 is surrounded by the spacer frame 12. Subsequently, a second molten UV curing resin 5a is supplied onto the UV cured resin 1, as shown in FIG. 11. Thereafter, as shown in FIG. 12, on the second molten UV curing resin 5a is placed the second top covering material 16 formed of white polyethylene terephthalate (PET) (Third step C). The second top covering material 16 is pressurized by a pressurizing plate 13. The pressurizing glass plate 13 is lowered a predetermined distance until it comes in contact with the top end surface of the spacer frame 12. After the second top covering material 16 is lowered, the second molten UV curing resin 5a is irradiated by the UV radiation means 14 through the pressurizing glass plate 13, thereby curing the second molten UV curing resin 5a, as shown in FIG. 13 (Fourth step D). Through this step, the first and second UV cured resin 1 and 5 are integrated. Through this integration, the bumps formed on the surface of the first UV cured resin are covered with the second UV cured resin 5, resulting in a flat surface. The integrated first and second UV cured resins 1 and 5 are taken out and cut into a predetermined form with a predetermined size by a cutter 15, as shown in FIG. 14, thereby manufacturing a card with a built-in electronic part K, as shown in FIG. 15 (Fifth step E).

As described above, since the card with a built-in electronic part K thus formed has a smooth surface, a thermal head for use in photographic printing of images such as a human face and letters can be evenly contacted with the entire surface of the card K via the image-receiving layer, with the result that good photographic printing is obtained.

The present invention is not limited to the embodiment described above. As the first top and bottom covering material 6 and 7, a glass plate may be used instead of polyethylene terephthalate (PET).

Instead of the molten UV curing resins 1a and 5a, a molten thermoset resin may be used.

In the aforementioned embodiment, after removing the first top and bottom covering material 6 and 7, the UV cured resin 1 is covered with a second top and bottom covering material 16 and 17. However, the card K may be formed by supplying a second molten resin 5a onto the cured resin 1 attached with the top and bottom covering material 6 and 7 without removing them. The card K thus formed may be improved in mechanical strength.

Furthermore, the first molten resin 1a may be different from the second molten resin 5a. For example, as the first molten resin 1a forming the core of a card, a resin having a low elastic modulus may be used, and a resin having an elastic modulus higher than that of the first curing resin 1 may be used as the second curing resin 5 forming the periphery of the card. The card obtained in this manner will be improved in mechanical strength against bend, torsion and the like.

Other than the resin having a different elastic modulus, a resin different in curing conditions may be used. For example, when a UV curing resin is used as the first molten resin 1a, and a thermoset resin may be used as the second molten resin 5a.

The first molten resin 1a and the second molten resin 5a may be different in color. When the card is formed by different colored resins, the resultant card has a two-tone colored cross section, which will be beneficial in preventing card forgery.

If the second molten resin 5a and the surface of the card K are formed in the same-tone color, a built-in electronic part cannot be seen through the surface of the card.

The second curing resin 5 covering the first curing resin 1 can be integrated with the first curing resin 1 so as to cover a part or the entire surface of the periphery thereof. If integrated, the removal of the second curing resin 5 from the first curing resin 1 can be successfully prevented.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a card with a built-in electronic part comprising:

a first supply step of providing a sealed electronic part and a coil antenna on a first bottom-covering material, and thereafter, supplying a first molten resin onto said sealed electronic part and said coil antenna, followed by providing a first top-covering material on a surface portion of said first molten resin;

a first curing step of curing said first molten resin supplied in said first supply step;

a second supply step of providing a second bottom-covering material on said first cured resin cured in said first curing step, and then, supplying a second molten resin over a surface of said second bottom covering material, and providing a second top-covering material on said second molten resin;

a second curing step of curing said second molten resin supplied in said second supply step and uniting said second cured resin with said first cured resin to make a first/second cured resin body; and a cutting step of cutting said first/second cured resin body into a card form.

2. A method of manufacturing a card with a built-in electronic part comprising:

a first supply step of providing a sealed electronic part and a coil antenna on a first bottom-covering material, and thereafter, supplying a first molten resin onto said sealed electronic part and said coil antenna, followed by providing a first top-covering material on a surface portion of said first molten resin;

a first curing step of curing said first molten resin supplied in said first supply step to make a first card-form larger than a final card-form;

a second supply step of providing a second bottom-covering material onto said first cured resin cured in said first curing step, and then, supplying a second molten resin over a surface of said second bottom covering material, and providing a second top-covering material over the second molten resin;

a second curing step of curing said second molten resin supplied in said second supply step and uniting said second cured resin with said first cured resin to make a first/second cured resin body; and a cutting step of cutting said first/second cured resin body into said final card-form.

\* \* \* \* \*